United States Patent
Jang et al.

(10) Patent No.: US 10,320,335 B1
(45) Date of Patent: Jun. 11, 2019

(54) COMPACT DOHERTY POWER AMPLIFIER USING NON-UNIFORM PHASE MATCH DEVICES

(71) Applicant: Infineon Technologies AG, Neubiberg (DE)

(72) Inventors: Haedong Jang, San Jose, CA (US); Bjoern Herrmann, Morgan Hill, CA (US); Zulhazmi Mokhti, Morgan Hill, CA (US); Richard Wilson, Morgan Hill, CA (US)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/962,672

(22) Filed: Apr. 25, 2018

(51) Int. Cl.
| | |
|---|---|
| *H03F 1/02* | (2006.01) |
| *H03F 3/193* | (2006.01) |
| *H03F 3/21* | (2006.01) |
| *H01L 23/66* | (2006.01) |
| *H03F 1/56* | (2006.01) |
| *H01L 23/00* | (2006.01) |

(52) U.S. Cl.
CPC .......... *H03F 1/0288* (2013.01); *H01L 23/66* (2013.01); *H03F 1/565* (2013.01); *H03F 3/193* (2013.01); *H03F 3/211* (2013.01); *H01L 24/48* (2013.01); *H01L 2223/6611* (2013.01); *H01L 2223/6627* (2013.01); *H01L 2223/6655* (2013.01); *H01L 2223/6661* (2013.01); *H01L 2224/48195* (2013.01); *H01L 2924/19041* (2013.01); *H01L 2924/19105* (2013.01); *H01L 2924/19107* (2013.01); *H01L 2924/30111* (2013.01); *H03F 2200/267* (2013.01); *H03F 2200/387* (2013.01); *H03F 2200/423* (2013.01); *H03F 2200/451* (2013.01); *H03F 2200/541* (2013.01); *H03F 2203/21139* (2013.01)

(58) Field of Classification Search
CPC ...................................................... H03F 1/0288
See application file for complete search history.

(56) References Cited

U.S. PATENT DOCUMENTS

| | | | |
|---|---|---|---|
| 2015/0145601 A1* | 5/2015 | Moronval | H03F 3/211 330/295 |
| 2016/0006399 A1* | 1/2016 | Blednov | H03F 1/0288 330/295 |
| 2016/0142025 A1* | 5/2016 | Volokhine | H03F 1/565 330/307 |
| 2017/0288613 A1* | 10/2017 | Pham | H03F 1/0288 |
| 2018/0034419 A1* | 2/2018 | Moronval | H03F 1/0288 |
| 2018/0254747 A1* | 9/2018 | Wong | H01L 23/66 |
| 2018/0254748 A1* | 9/2018 | Grebennikov | H03F 1/0288 |

* cited by examiner

*Primary Examiner* — Patricia T Nguyen
(74) *Attorney, Agent, or Firm* — Slater Matsil, LLP

(57) ABSTRACT

An RF amplifier includes an amplifier chip on a flange having an input and an output comprising a parasitic capacitance and a parasitic inductance, a first chip capacitor coupled to the output of the output of the amplifier by a first plurality of bond wires, and a second chip capacitor coupled to the first chip capacitor by a second plurality of bond wires, and an output impedance matching network having an input coupled to the output of the second chip capacitor by a third plurality of bond wires, and an output, and a phase shift between the input and the output of less than 90 degrees, wherein the phase shift from the output of the amplifier chip to the output of the output impedance matching network is 180 degrees.

20 Claims, 4 Drawing Sheets

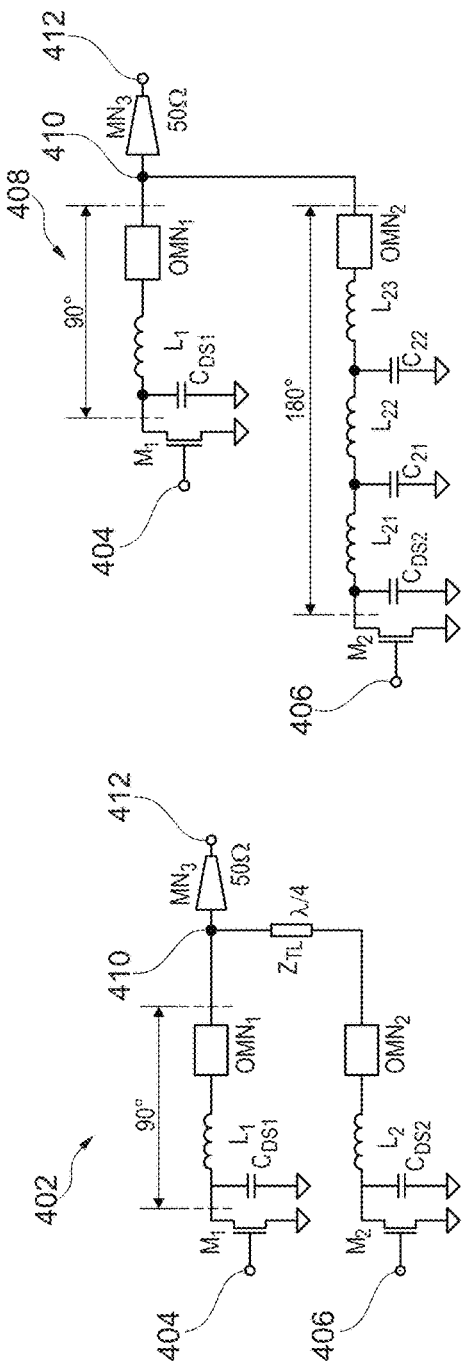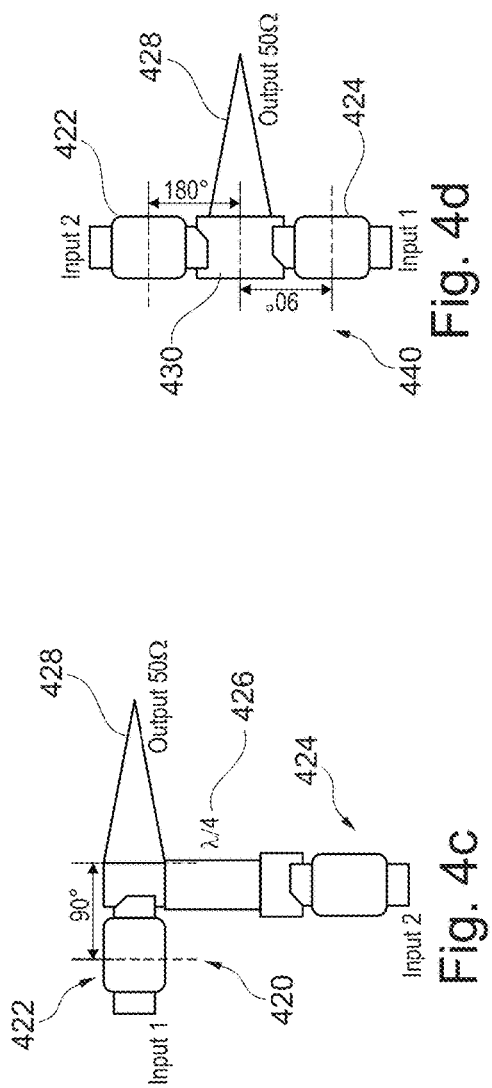
Fig. 4b
Fig. 4d
Fig. 4a
Fig. 4c

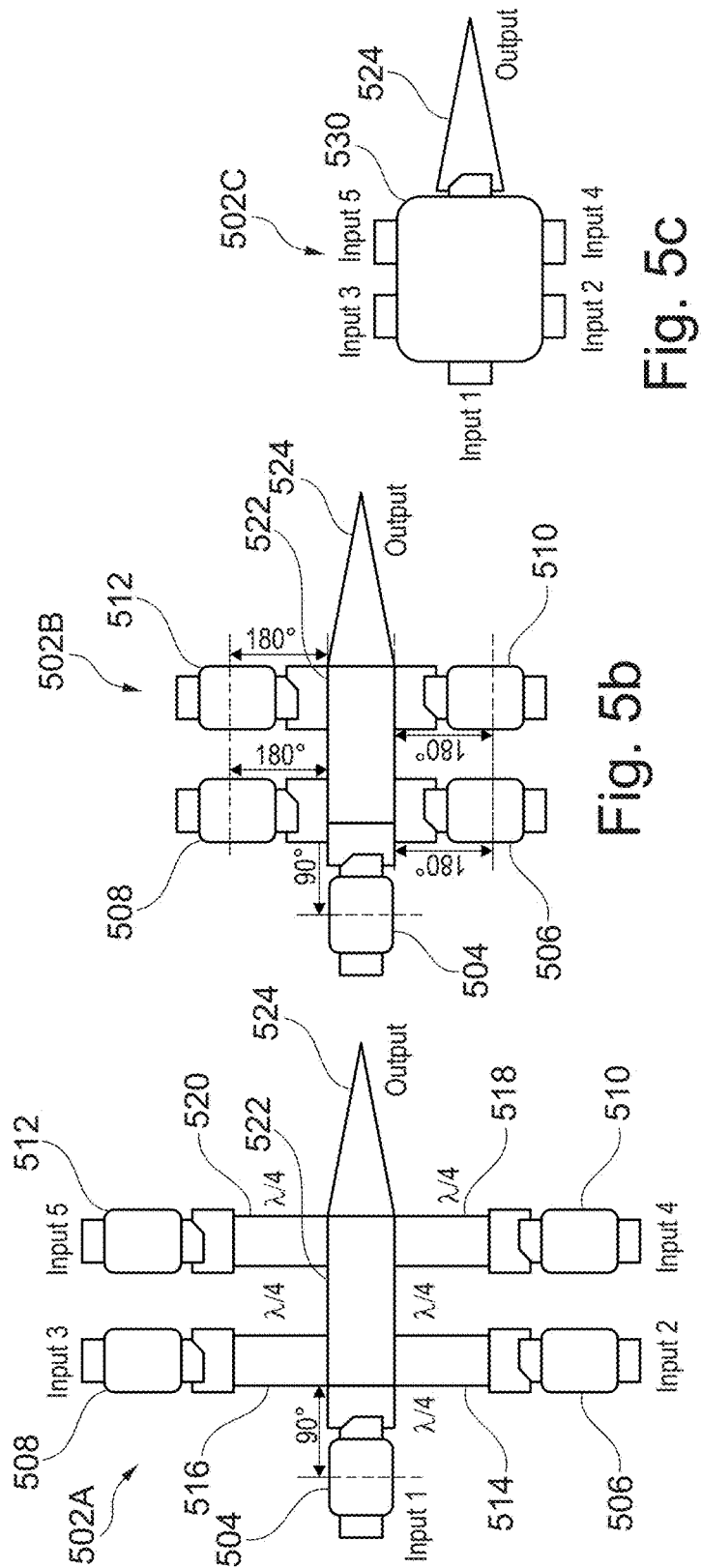

COMPACT DOHERTY POWER AMPLIFIER USING NON-UNIFORM PHASE MATCH DEVICES

TECHNICAL FIELD

The present invention relates generally to a compact Doherty power amplifier using non-uniform phase match devices.

BACKGROUND

RF power amplifiers are important elements in wireless communication infrastructure. One of the key cost factors of wireless service providers is the real estate rental cost of the base-station installation including the RF power amplifiers. A small form factor of the power amplifiers is therefore of high interest to wireless service providers. The Doherty power amplifier topology and its derivatives are one of the most preferred topologies due to its simple architecture and high efficiency operation for modulated signals. However, with the highly increasing demand of data traffic, the footprint of the Doherty power amplifier is getting larger in order to meet the large power back-off operation for high efficiency with the modulated signals. One of the most typical way of improving average efficiency is using multiple way or multiple stage Doherty amplifiers, which take up a large space.

SUMMARY

An RF amplifier comprises an amplifier chip on a flange having an input and an output comprising a parasitic capacitance and a parasitic inductance; a first chip capacitor coupled to the output of the output of the amplifier by a first plurality of bond wires; and a second chip capacitor coupled to the first chip capacitor by a second plurality of bond wires; and an output impedance matching network having an input coupled to the output of the second chip capacitor by a third plurality of bond wires, and an output, and a phase shift between the input and the output of less than 90 degrees, wherein the phase shift from the output of the amplifier chip to the output of the output impedance matching network is 180 degrees.

According to embodiments, a device design method achieves a small form factor without compromising amplifier performance.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 (b) shows a conventional two-way Doherty amplifier implementation structure;

FIG. 2 (b) shows a conventional three-way Doherty amplifier implementation structure;

FIG. 3 (b) is a practical device schematic with parasitic components, an output matching network, and additional internal matching elements according to an embodiment;

FIG. 3 (c) is an implementation of the device schematic of FIG. 3 (a);

FIG. 3 (d) is an implementation of the device schematic of FIG. 3 (b) according to an embodiment, using chip capacitors and bonding wires;

FIG. 4 (a) is a conventional Doherty amplifier schematic with the quarter wave length transmission line;

FIG. 4 (b) is a Doherty amplifier schematic with a 180° phase shift match device, according to an embodiment;

FIG. 4 (c) is a layout example of the conventional Doherty amplifier of FIG. 4 (a);

FIG. 4 (d) is a layout example of the Doherty amplifier of FIG. 4 (b), according to an embodiment;

FIG. 5 (a) is a layout embodiment of the three-way Doherty amplifier of FIG. 2 (b);

FIG. 5 (b) is a more compact layout embodiment of the three-way Doherty amplifier, according to an embodiment; and FIG. 5 (c) is an even more compact layout embodiment of the three-way Doherty amplifier, according to an embodiment.

DETAILED DESCRIPTION OF ILLUSTRATIVE EMBODIMENTS

Doherty power amplifier architectures are known in the art and include at least one main amplifier and one peaking amplifier. The outputs of the main amplifier and peaking amplifier are typically added together to provide an output signal with maximum linearity. The input and output paths of the main amplifier and peaking amplifier typically include phase shifting. For example, a phase shift of $\lambda/4$ (ninety degrees) in the output of the peaking amplifier provided by a transmission line segment is typically used in a two-way Doherty power amplifier.

Figure 1:
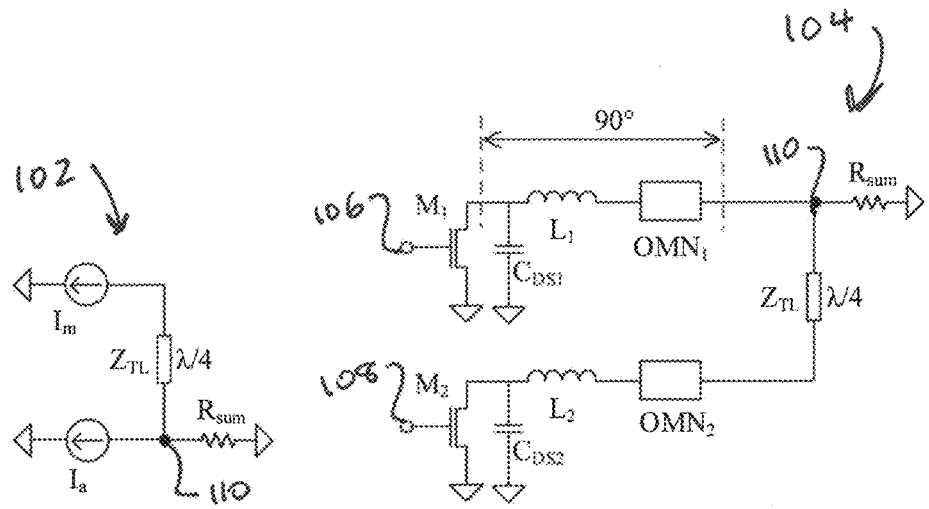
FIG. 1 (a) shows an ideal two-way Doherty amplifier architecture.

FIG. 1 (a) shows an ideal two-way Doherty amplifier architecture 102 including a main amplifier current source $I_m$ in series with a phase shift impedance $Z_{TL}$ (delay line) having a phase shift of $\lambda/4$ (ninety degrees) coupled to node 110. A peaking amplifier current source $I_a$ is also coupled to node 110. The ideal two-way Doherty amplifier architecture 102 is completed with a summing resistance $R_{sum}$ coupled from node 110 to ground.

FIG. 1 (b) shows a typical implementation structure 104 of a two-way Doherty amplifier in the presence of the non-negligible parasitic components. Implementation 104 includes a main amplifier represented by transistor $M_1$ having a gate coupled to input node 106, and a source coupled to ground. Other more complicated amplifiers can be used as is known by those skilled in the art. In FIG. 1 (b) the drain of transistor $M_1$ is shown to be coupled to parasitic components including a parasitic capacitance $C_{DS1}$ coupled to ground, and a series-coupled parasitic inductance $L_1$. Parasitic inductance $L_1$ is coupled to a first output impedance matching network $OMN_1$, which in turn is coupled to summing node 110. Similarly, the drain of transistor $M_2$ (representing an implementation of the peaking amplifier) is shown to be coupled to parasitic components including a parasitic capacitance $C_{DS2}$ coupled to ground, and a series-coupled parasitic inductance $L_2$. Parasitic inductance $L_2$ is coupled to a second output impedance matching network OMN2, which in turn is coupled to summing node 110 through phase shifting impedance $Z_{TL}$ having a phase shift of ninety degrees. The main amplifier current ($I_m$) and the peaking amplifier current ($I_a$) are combined at the summing node 110 where the load at the summing node is represented by $R_{sum}$. However, the RF power devices such as laterally diffused metal oxide semiconductors (LDMOS) or gallium nitride (GaN) devices have non-negligible parasitic components such as the drain to source capacitance (CDS) or the drain wire inductance ($L_1$), previously described. Those parasitic components introduce phase shifts in the RF signals. The conventional design practices use the output impedance matching networks (OMN) such that the matched devices have a ninety degree phase shift. Therefore, as shown in FIG. 1 (b), the output matching network behaves as the Doherty impedance inverter. However, it inverts the peaking amplifier signal as well requiring the additional quarter wave length delay line ($Z_{TL}$) as depicted in FIG. 1 (b) in order to compensate the ninety degree phase shift.

Figure 2:
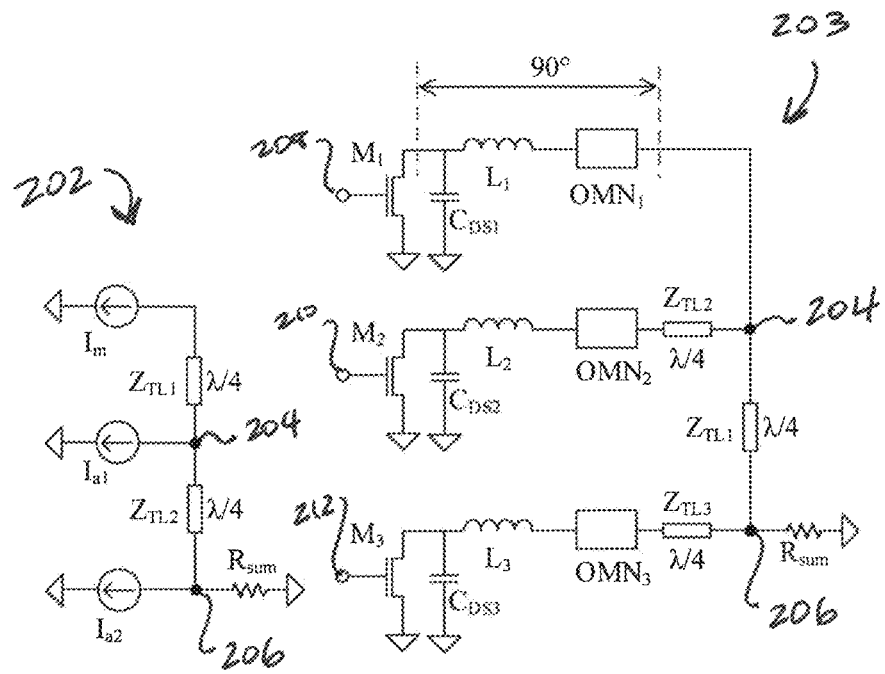
FIG. 2 (a) shows an ideal three-way Doherty amplifier architecture.

FIG. 2 (a) shows an ideal three-way Doherty amplifier architecture 202 including a main amplifier current source $I_m$ in series with a first phase shift impedance $Z_{TL}$ (delay line) having a phase shift of λ/4 (ninety degrees) coupled to node 204. A first peaking amplifier current source $I_{a1}$ is also coupled to node 204. A second peaking amplifier current source $I_{a2}$ is coupled to node 206, and a second phase shift impedance $Z_{TL2}$ (delay line) having a phase shift of λ/4 (ninety degrees) is coupled between nodes 204 and 206. The ideal three-way Doherty amplifier architecture 202 is completed with a summing resistance $R_{sum}$ coupled from node 206 to ground.

FIG. 2 (b) shows a typical implementation structure 203 of a two-way Doherty amplifier in the presence of the non-negligible parasitic components. Implementation 203 includes a main amplifier represented by transistor $M_1$ having a gate coupled to input node 208, and a source coupled to ground. Other more complicated amplifiers can be used as is known by those skilled in the art. In FIG. 2 (b) the drain of transistor $M_1$ is shown to be coupled to parasitic components including a parasitic capacitance $C_{DS1}$ coupled to ground, and a series-coupled parasitic inductance $L_1$. Parasitic inductance $L_1$ is coupled to a first output impedance matching network $OMN_1$, which in turn is coupled to node 204. Similarly, the drain of transistor M2 representing the first peaking amplifier is shown to be coupled to parasitic components including a parasitic capacitance $C_{DS2}$ coupled to ground, and a series-coupled parasitic inductance $L_2$. Parasitic inductance $L_2$ is coupled to a second output impedance matching network $OMN_2$, which in turn is coupled to node 204 through phase shifting impedance $Z_{TL2}$ having a phase shift of ninety degrees. Similarly, the drain of transistor $M_3$ representing the second peaking amplifier is shown to be coupled to parasitic components including a parasitic capacitance $C_{DS3}$ coupled to ground, and a series-coupled parasitic inductance $L_3$. Parasitic inductance $L_3$ is coupled to a third output impedance matching network $OMN_3$, which in turn is coupled to node 206 through phase shifting impedance $Z_{TL3}$ having a phase shift of ninety degrees. A phase shifting impedance $ZTL_1$ also having a phase shift of ninety degrees is coupled between nodes 204 and 206. The main amplifier current ($I_m$) and the peaking amplifier currents ($I_{a1}$ and $I_{a2}$) are combined at the summing node 206 where the load at the summing node is represented by $R_{sum}$.

The amplifier circuit 203 of FIG. 2 (b) shows one of the conventional 3-way Doherty power amplifier implementation examples using the power devices with the parasitic components. As can be seen from both FIG. 1 (b) and FIG. 2 (b), the phase matching quarter wave length transmission lines ($Z_{TL1}$, $Z_{TL2}$, and $Z_{TL3}$) are required on a printed circuit board (PCB) resulting in a large power amplifier form factor. The impedance inverter ($Z_{TL1}$) of FIG. 2(a) is replaced by the output impedance matching network ($OMN_1$) of the main device ($M_1$) of FIG. 2 (b). However, using the same device topology, the peaking devices ($M_2$ and $M_3$) require additional phase delay lines ($Z_{TL2}$ and $Z_{TL3}$) to compensate for the phase shift introduced by the output matching networks ($OMN_2$ and $OMN_3$) for proper Doherty power combining at the nodes 204 and 206.

According to embodiments, a customized RF power device design method for a smaller power amplifier footprint is used that reduces the wireless service providers' real estate rental costs. According to embodiments, power devices have an internal matching network using bonding wires and chip capacitors. Then, the device is matched to a wanted impedance and phase on the board collectively resulting in a ninety degree phase shift from the device intrinsic node to the design reference plane on the board. Embodiments introduce non-uniform phase match devices. In other words, at least one of the devices is internally matched to collectively provide a ninety degree phase shift between the device intrinsic node to the design reference plane whereas at least one of the other devices are internally matched to collectively provide 180° phase shift such that the external quarter wave length delay lines are absorbed inside the package using the chip and wire components, and large separate quarter wave length delay lines need not be used. Therefore, using the two or multiple devices with different phase matches for a Doherty amplifier design, the lateral dimensions of the power amplifier are reduced.

Figure 3:
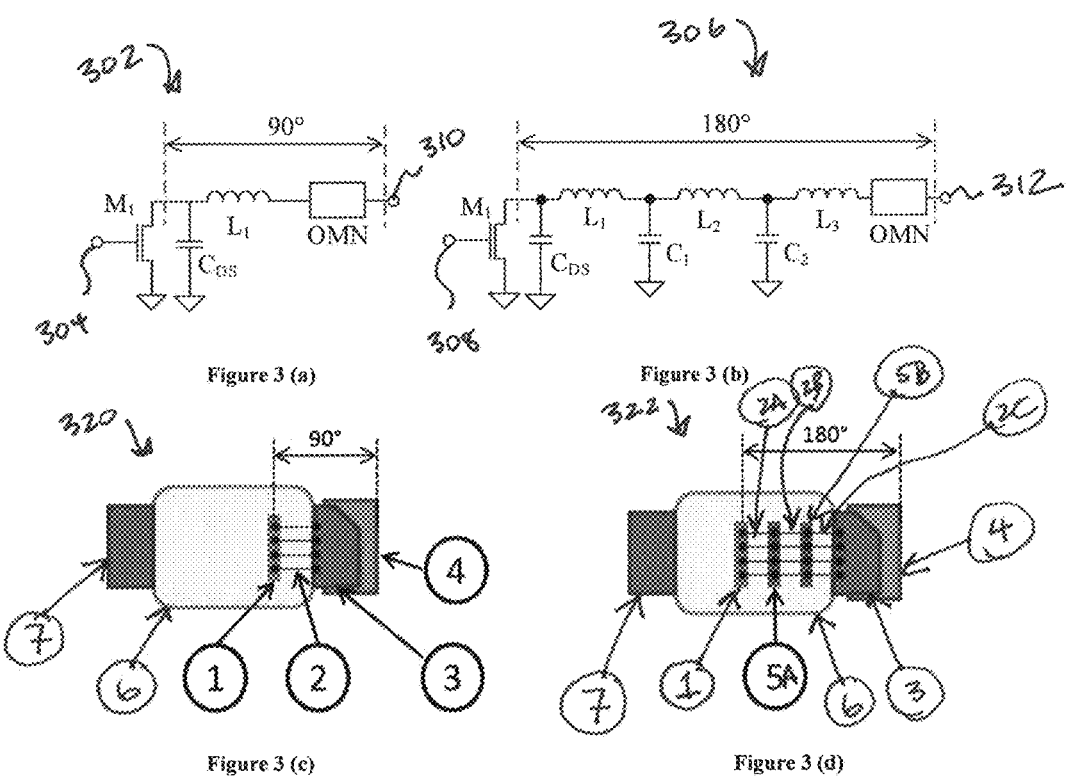
FIG. 3 (a) is a practical device schematic with parasitic components and an output matching network.

The non-uniform phase match device implementations are described in further detail. FIG. 3 (a) shows a schematic diagram 302 of the typical device which is matched to collectively provide 90° phase shift. Typical power devices such as transistor $M_1$ have non-negligible parasitic components. The gate of transistor $M_1$ is coupled to the input node 304. The dominant parasitic components are the drain-to-source parasitic capacitance ($C_{DS}$) and the drain-to-package inductance ($L_1$). These parasitic components are effectively absorbed into the output matching network (OMN) resulting in a ninety degree phase shift to the design reference plane on the PCB from the drain of transistor $M_1$ to the output node 310. The OMN could include the package parasitic components or additional internal chip and bonding wires together with the transmission lines on a PCB depending on the matching topology. The electrical length of the devices between the intrinsic nodes to the package reference plane is typically less than ninety degrees and could become ninety degrees with an additional piece of transmission line for layout convenience. One embodiment 320 of this type of device is shown in FIG. 3 (c).

The devices shown in embodiment 320 of FIG. 3 (c) comprise a die (1), that may comprise one or more transistors or one or more amplifiers, bonding wires (2), that may include one or more bonding wires, a package output lead (3), coupled to the output of the transistor or amplifier, and a transmission line on a PCB (4), or other matching stubs, which are omitted in this example. Also shown in FIG. 3 (c) a flange (6) that is coupled to ground, and an package input lead (7). The input bonding wires between the input lead (7) and the die (1) are not shown in the example of embodiment 320 of FIG. 3 (c). The phase shift between the die (1) intrinsic node (drain of transistor $M_1$) and the output node 310 (end of transmission line on PCB (4)) is made to be ninety degrees in the example embodiment 320.

The schematic of an embodiment device 306 is shown in FIG. 3 (b). The quarter wave length transmission lines that would otherwise be implemented as large quarter wavelength transmission lines can instead be implemented using lumped elements inside the package or the output matching network OMN is implemented inside the package using additional chip and wires to collectively provide 180° phase shift between the intrinsic node (drain of transistor $M_1$) to the design reference plane (output node 312). In other words, the external transmission line that would otherwise be used is replaced by using the internal quasi-lumped components such as chip capacitors and bonding wires ($L_1$, $C_1$, $L_2$, $C_2$, and L3). The transmission lines can be represented by using lumped elements either maintaining the characteristic impedance of the transmission line or not.

One embodiment 322 of device 306 is shown FIG. 3 (*d*) where chip capacitors (5A) and (5B) are shown. Note that there are three sets of bonding wires also shown. Bonding wires (2A) connect the die (1) to the first chip capacitor (5A). Bonding wires (2B) connect the first chip capacitor (5A) to the second chip capacitor (5B). Bonding wires (2C) connect the second chip capacitor to the package output lead (3). Therefore, the electrical length of this type of device between the intrinsic node (drain of transistor $M_1$) to the package could be above 90° and below 180°. In FIG. 3 (*d*) a phase shift of 180° between the intrinsic device drain node to node 312 is shown. The gate of transistor $M_1$ is coupled to input node 308. The embodiment 322 thus provides a full phase shift of 180° without the use of large quarter wavelength transmission lines that increase the footprint of the amplifier implementation.

A typical Doherty amplifier configuration 402 is shown in FIG. 4 (*a*) where only ninety degree phase shift devices are used and its corresponding layout 420 is shown in FIG. 4 (*c*). Referring to FIG. 4 (*a*), as previously described, a main amplifier includes an input node 404, transistor $M_1$, parasitic elements $C_{DS1}$ and $L_1$, and an output matching network $OMN_1$ coupled to summing node 410. A peaking amplifier includes an input node 406, transistor $M_2$, parasitic elements $C_{DS2}$ and $L_2$, and an output matching network $OMN_2$ coupled to summing node 410 through quarter wavelength transmission line $Z_{TL}$. Summing node 410 is coupled to impedance transformer MN3 to output node 412 to present a 50Ω output impedance.

Layout 420 of FIG. 4 (*c*) includes a first amplifier (main amplifier) implementation 422 associated with a first input as previously described, a second amplifier (peaking amplifier) implementation 424 as previously described, a quarter wavelength transmission line 426, and an impedance transformer 428 to provide the 50Ω output impedance.

Another Doherty amplifier schematic 408 using non-uniform phase matched devices according to embodiments is shown in FIG. 4 (*b*) and its corresponding layout 440 is shown in FIG. 4 (*d*). Referring to FIG. 4 (*b*), as previously described, a main amplifier includes an input node 404, transistor $M_1$, parasitic elements $C_{DS1}$ and $L_1$, and an output matching network $OMN_1$ coupled to summing node 410. A peaking amplifier includes an input node 406, transistor $M_2$, parasitic elements $C_{DS2}$ and $L_{21}$, chip capacitors $C_{21}$ and $C_{22}$, bond wires $L_{22}$ and $L_{23}$, and an output matching network $OMN_2$ coupled to summing node 410. Summing node 410 is coupled to impedance transformer MN3 to output node 412 to present a 50Ω output impedance.

As can be seen in the layout 440 shown in FIG. 4 (*d*), the form factor of layout 440 takes less space than the layout 420 shown in FIG. 4 (*c*) by using the non-uniform phase matched devices (chip capacitors and bond wires). The summing node impedance is transformed to the system impedance, 50Ω, using an impedance transformer (MN3) and is marked as 428 in the layouts of FIGS. 4 (*c*) and 4 (*d*). Layout 440 of FIG. 4 (*d*) includes the first amplifier implementation 424, which has a phase shift of ninety degrees between the drain of transistor $M_1$ and the summing node 410, which is part of element 430. Element 430 is a small transmission line portion that has a phase shift of less than ninety degrees and can be calculated as part of the phase shift associated with output matching network $OMN_1$. Layout 440 of FIG. 4 (*d*) also includes the second amplifier implementation 422, which has a phase shift of 180° between the drain of transistor $M_2$ and the summing node 410, which is part of element 430. Element 430 as previously described is a small transmission line portion that has a phase shift of less than ninety degrees and can be calculated as part of the phase shift associated with output matching network $OMN_2$. As previously described impedance transformer 428 is also shown. Note that the form factor of layout 440 of FIG. 4 (*d*) is smaller than that of the form factor of layout 420 of FIG. 4 (*c*) due to the use of non-uniform phase shift devices and the elimination of the quarter wavelength transmission line 426.

The embodiment method can be applied to three-way Doherty amplifiers as well to decrease the amplifier form factor. One exemplary three-way Doherty amplifier which has the device size ratio $M_1:M_2:M_3=1:2:2$ (wherein $M_1$ is a transistor representing the main amplifier, $M_2$ is a transistor representing a first auxiliary amplifier, and $M_3$ is a transistor representing a second auxiliary amplifier) can be implemented as can be seen in FIG. 5 (*a*) using only the ninety degree phase shift devices or using the proposed non-uniform phase matched devices as shown in FIG. 5 (*b*).

FIG. 5 (*a*) shows a three-way Doherty amplifier 502A in which Input 1 is associated with the main amplifier 504 having an output phase shift of ninety degrees. Input 2 and Input 3 are associated with the first auxiliary amplifier split into two amplifier halves 506 and 508, each having an output phase shift of ninety degrees, with the additional ninety degrees of phase shift being provided by quarter wave transmission lines 514 and 516. Similarly, Input 4 and Input 5 are associated with the second auxiliary amplifier split into two amplifier halves 510 and 512, each having an output phase shift of ninety degrees, with the additional ninety degrees of phase shift being provided by quarter wave transmission lines 518 and 520. The outputs of all of the amplifiers are coupled together with another quarter wave transmission line 522, and then to the output impedance transformer 524.

FIG. 5 (*b*) shows a three-way Doherty amplifier 502B, wherein quarter wave transmission lines 514, 516, 518, and 520 are eliminated according to an embodiment, leading to a smaller form factor than three-way Doherty amplifier 502A shown in FIG. 5 (*a*). Input 1 is again associated with the main amplifier 504 having an output phase shift of ninety degrees. Input 2 and Input 3 are associated with the first auxiliary amplifier split into two amplifier halves 506 and 508, each having an output phase shift of 180 degrees, using non-uniform phase matched devices (such as discrete chip capacitors and bond wires) as previously discussed. Similarly, Input 4 and Input 5 are associated with the second auxiliary amplifier split into two amplifier halves 510 and 512, each having an output phase shift of 180 degrees, using non-uniform phase matches devices (such as discrete chip capacitors and bond wires) as previously discussed. The outputs of all of the amplifiers are still coupled together with another quarter wave transmission line 522, and then to the output impedance transformer 524.

The embodiment method can achieve smaller power amplifier layout areas by replacing the quarter wave length transmission lines with the internal lumped element matching. Furthermore, the center quarter wave length transmission line 522 of FIG. 5 (*b*) can be implemented in a single package as well using the lumped chip capacitors and wires of which the output impedance 530 is the summing node impedance as can be seen in FIG. 5. (*c*). The device in FIG. 5 (*c*) could have fully chip and wire internally matched components or partial chip and wire matching network with internal PCB using system in a chip technology. The embodiment method can be also applied to other types of 3-way Doherty amplifiers or N-way Doherty amplifiers without limitation.

FIG. 5 (*c*) shows a three-way Doherty amplifier 502C, wherein quarter wave transmission lines 514, 516, 518, 520, and 522 are eliminated according to an embodiment, leading to a smaller form factor than three-way Doherty amplifier 502A shown in FIG. 5 (*a*) or three-way Doherty amplifier 502B shown in FIG. 5 (*b*). Input 1 is again associated with the main amplifier 504 having an output phase shift of ninety degrees provided in a single amplifier package 530. Input 2 and Input 3 are associated with the first auxiliary amplifier split into two amplifier halves 506 and 508, each having an output phase shift of 180 degrees, using non-uniform phase matched devices (such as discrete chip capacitors and bond wires) as previously discussed provided in the single amplifier package 530. Similarly, Input 4 and Input 5 are associated with the second auxiliary amplifier split into two amplifier halves 510 and 512, each having an output phase shift of 180 degrees, using non-uniform phase matches devices (such as discrete chip capacitors and bond wires) as previously discussed provided in the single amplifier package 530. The outputs of all of the amplifiers are still coupled together and then to the output impedance transformer 524.

Embodiment methods can be used for a compact Doherty RF power amplifier of customer systems. Therefore, suppliers and customers can utilize this embodiment method to reduce system power amplifier foot-print. The embodiment method can be used to develop and provide customized devices for compact customer power amplifiers without compromising performance.

According to embodiments the quarter wave length transmission line on a PCB is replaced by using the internal chip and wire quasi-lumped elements to minimize the RF power amplifier size resulting in non-uniform phase matched customized devices for an amplifier.

Embodiment methods can be used in two-way, three-way or multiple-way Doherty or outphasing amplifier topologies where the multiple-phase-matched devices can benefit without limitation. The electrical phases of 90° or 180° do not have to be completed inside an integrated circuit amplifier package. A substantial amount of output phase shift can be implemented inside the package and the rest of the required phase shift can be completed on a PCB using minor pieces of transmission line on the PCB for the layout convenience if needed.

Embodiment methods also include cases including the same or different harmonic or baseband frequency responses of the circuits without exclusion. Amplifier 502C shown in FIG. 5 (*c*), for example, could be fully implemented using capacitor and amplifier chips and bond wires (the length and number of the bond wires can be used to adjust the output phase shift as required) inside the package or partially using the chip and wire with internal boards, for example, using system in a chip techniques previously discussed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A two-way Doherty amplifier comprising:
   a first amplifier having an input and an output comprising a parasitic capacitance and a parasitic inductance;
   a first output impedance matching network having an input coupled to the output of the first amplifier, and an output, and a phase shift between the input and the output of less than 90 degrees;
   a second amplifier having an input and an output comprising a parasitic capacitance and a parasitic inductance;
   a second output impedance matching network having an input and an output, and a phase shift between the input and the output of less than 90 degrees;
   a chip capacitor coupled to the output of the second amplifier by at least one first bond wire, and to the input of the second output impedance matching network by at least one second bond wire; and
   an impedance transformer having an input coupled to the output of the first output impedance matching network and to the output of the second output impedance matching network, and an output.

2. The two-way Doherty amplifier of claim 1, comprising a phase shift of 90 degrees between the first amplifier output and the input of the impedance transformer.

3. The two-way Doherty amplifier of claim 1, comprising a phase shift of 180 degrees between the second amplifier output and the input of the impedance transformer.

4. The two-way Doherty amplifier of claim 1, wherein the chip capacitor comprises a plurality of chip capacitors coupled together with a least one third bond wire.

5. The two-way Doherty amplifier of claim 1, wherein the at least one first bond wire comprises a plurality of bond wires.

6. The two-way Doherty amplifier of claim 1, wherein the at least one second bond wire comprises a plurality of bond wires.

7. The two-way Doherty amplifier of claim 1, wherein a first input signal associated with the first amplifier input is phase shifted from a second input signal associated with the second amplifier input.

8. A three-way Doherty amplifier comprising:
   a first amplifier having an input and an output comprising a parasitic capacitance and a parasitic inductance;
   a first output impedance matching network having an input coupled to the output of the first amplifier, and an output, and a phase shift between the input and the output of less than 90 degrees;
   a second amplifier having an input and an output comprising a parasitic capacitance and a parasitic inductance;
   a second output impedance matching network having an input and an output, and a phase shift between the input and the output of less than 90 degrees;
   a third amplifier having an input and an output comprising a parasitic capacitance and a parasitic inductance;
   a third output impedance matching network having an input and an output, and a phase shift between the input and the output of less than 90 degrees;
   a first chip capacitor coupled to the output of the second amplifier by at least one first bond wire, and to the input of the second output impedance matching network by at least one second bond wire; and
   a second chip capacitor coupled to the output of the third amplifier by at least one third bond wire, and to the input of the second output impedance matching network by at least one fourth bond wire;

a quarter wavelength impedance transformer having an input coupled to the output of the second output impedance matching network, and an output coupled to the output of the third output impedance matching network; and an output impedance transformer having an input coupled to the output of the third output impedance matching network and the output of the quarter wavelength impedance transformer, and an output.

9. The three-way Doherty amplifier of claim 8, comprising a phase shift of 90 degrees between the first amplifier output and the input of the quarter wavelength impedance transformer.

10. The three-way Doherty amplifier of claim 8, comprising a phase shift of 180 degrees between the second amplifier output and the input of the quarter wavelength impedance transformer.

11. The three-way Doherty amplifier of claim 8, comprising a phase shift of 180 degrees between the third amplifier output and the input of the output impedance transformer.

12. The three-way Doherty amplifier of claim 8, wherein at least one of the first and second chip capacitors comprises a plurality of chip capacitors coupled together with a least one fifth bond wire.

13. The three-way Doherty amplifier of claim 8, wherein the at least one first bond wire and the at least one second bond wire each comprise a plurality of bond wires.

14. The three-way Doherty amplifier of claim 8, wherein the at least one third bond wire and the at least one fourth bond wire each comprise a plurality of bond wires.

15. The three-way Doherty amplifier of claim 8, wherein a first input signal associated with the first amplifier input is phase shifted from a second input signal associated with the second amplifier input.

16. The three-way Doherty amplifier of claim 8, wherein a first input signal associated with the first amplifier input is phase shifted from a third input signal associated with the third amplifier input.

17. An RF amplifier comprising:

an amplifier chip on a flange having an input and an output comprising a parasitic capacitance and a parasitic inductance;

a first chip capacitor coupled to the output of the output of the amplifier chip by a first plurality of bond wires; and a second chip capacitor coupled to the first chip capacitor by a second plurality of bond wires; and an output impedance matching network having an input coupled to the output of the second chip capacitor by a third plurality of bond wires, and an output, and a phase shift between the input and the output of less than 90 degrees, wherein the phase shift from the output of the amplifier chip to the output of the output impedance matching network is 180 degrees.

18. The RF amplifier of claim 17, wherein the output impedance matching network comprises a transmission line.

19. The RF amplifier of claim 17, wherein the input of the amplifier chip is coupled to a conductive gate portion proximate to and electrically isolated from the flange.

20. The RF amplifier of claim 17, wherein the output of the amplifier chip is coupled to a conductive drain portion proximate to and electrically isolated from the flange.

* * * * *